United States Patent
Lou et al.

(10) Patent No.: US 10,890,614 B2
(45) Date of Patent: Jan. 12, 2021

(54) METHOD FOR DETERMINING A JUNCTION TEMPERATURE OF A DEVICE UNDER TEST AND METHOD FOR CONTROLLING A JUNCTION TEMPERATURE OF A DEVICE UNDER TEST

(71) Applicant: STAR TECHNOLOGIES, INC., Hsinchu (TW)

(72) Inventors: Choon Leong Lou, Hsinchu (TW); Yi Ming Lau, Hsinchu (TW)

(73) Assignee: STAR TECHNOLOGIES, INC., Hsinchu (TW)

( * ) Notice: Subject to any disclaimer, the term of this patent is extended or adjusted under 35 U.S.C. 154(b) by 29 days.

(21) Appl. No.: 16/384,579

(22) Filed: Apr. 15, 2019

(65) Prior Publication Data
US 2020/0326366 A1 Oct. 15, 2020

(51) Int. Cl.
*G01R 31/26* (2020.01)
*H01L 21/67* (2006.01)

(52) U.S. Cl.
CPC ..... *G01R 31/2642* (2013.01); *G01R 31/2632* (2013.01); *H01L 21/67248* (2013.01)

(58) Field of Classification Search
None
See application file for complete search history.

(56) References Cited

U.S. PATENT DOCUMENTS

| | | | |
|---|---|---|---|
| 5,070,322 A * | 12/1991 | Fujihira | G01K 7/01 257/470 |
| 9,224,670 B2 | 12/2015 | Kaeriyama | |
| 2002/0014894 A1 * | 2/2002 | Yonezawa | G01R 1/0491 324/750.08 |
| 2008/0164899 A1 * | 7/2008 | Ando | G01R 31/2874 324/750.13 |
| 2016/0161547 A1 * | 6/2016 | Farquhar, III | G01R 31/2827 361/118 |

FOREIGN PATENT DOCUMENTS

| | | |
|---|---|---|
| CN | 103681628 B | 1/2018 |
| TW | I418822 B | 12/2013 |

OTHER PUBLICATIONS

Office Action and Search Report dated Dec. 31, 2019 issued by Taiwan Intellectual Property Office for counterpart application 108130013.
Brief English Translation of Office Action and Search Report.
English Abstract Translation of Foreign Reference CN 103681628 B.
English Abstract Translation of Foreign Reference TW I418822 B.
Office Action and Search Report dated Apr. 28, 2019 issued by Taiwan Intellectual Property Office for counterpart application No. 108130013.
English Abstract Translation of Office Action.

* cited by examiner

*Primary Examiner* — Jas A Sanghera
(74) *Attorney, Agent, or Firm* — WPAT, P.C., Intellectual Property Attorneys; Anthony King

(57) ABSTRACT

The present disclosure provides a method for controlling a junction temperature of a device under test, including applying a reverse bias to a reference diode adjacent to the device under test, obtaining a calibration current of the reference diode under the reverse bias, deriving the junction temperature of the device under test according to the reference diode, and adjusting an environment temperature when the junction temperature of the device under test is deviated from a predetermined value by a predetermined temperature range.

17 Claims, 11 Drawing Sheets

US 10,890,614 B2

1

METHOD FOR DETERMINING A JUNCTION TEMPERATURE OF A DEVICE UNDER TEST AND METHOD FOR CONTROLLING A JUNCTION TEMPERATURE OF A DEVICE UNDER TEST

BACKGROUND

A diode of a semiconductor device may have a junction. A junction is an interface in a semiconductor device between two types of semiconductor materials, wherein the two types of semiconductor materials have different electrical characteristics, and the electrical characteristics determines the properties of the semiconductor device.

In order to characterize a semiconductor device with improved accuracy under different junction temperature, it is entailed to determine a junction temperature of the device with better accuracy and control the junction temperature of the device to be within a desirable range. Thereby the characterization of the semiconductor device can be performed while avoiding the risk of the junction temperature of the device significantly deviated from a target value.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
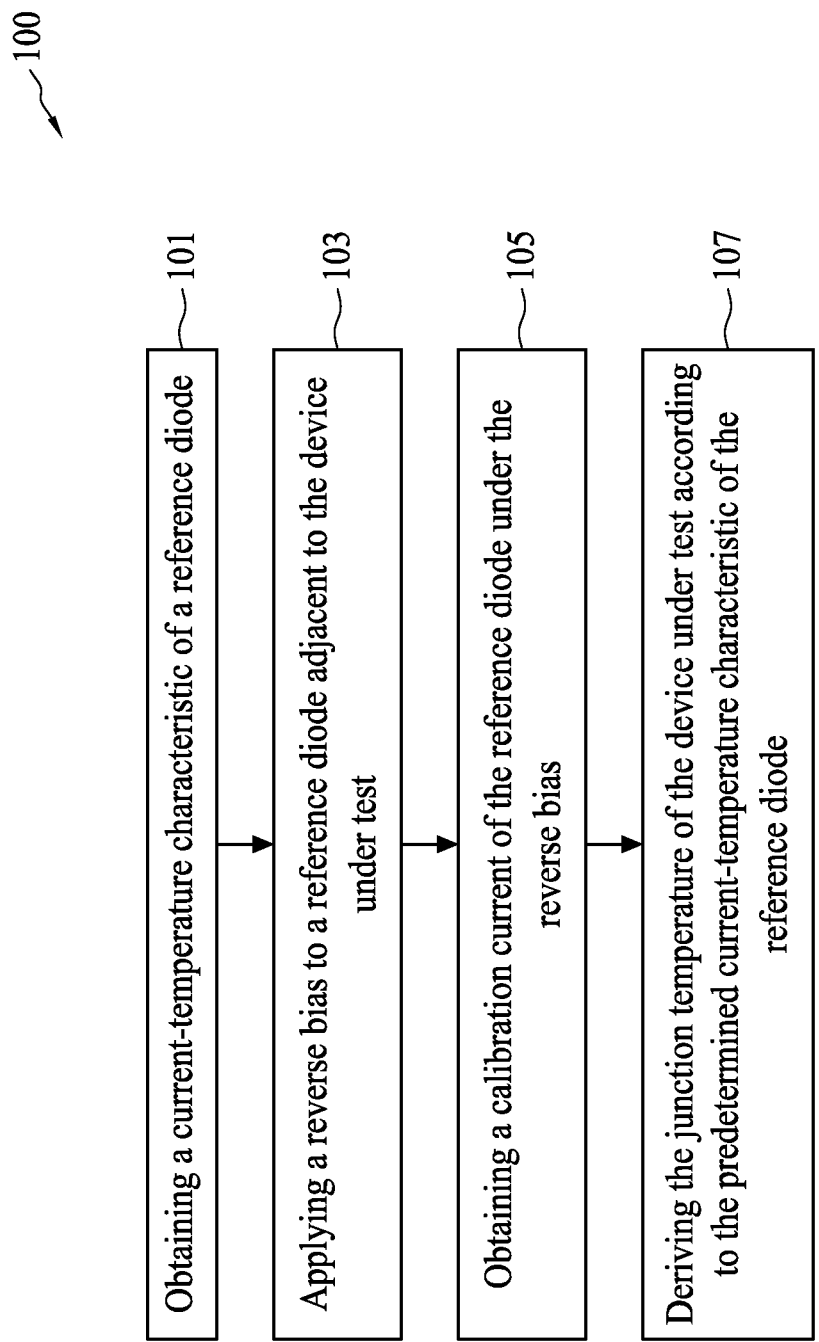
FIG. 1 shows a flow chart representing various operations of a method for determining a junction temperature of a device under test, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In order to characterize a device by testing with improved precision, the knowledge of factors related to the condition of the device is often required. For example, the junction temperature is sensitive to performance of devices, thus it is a factor when characterizing a device.

However, under the trend of device miniaturization and the configuration of semiconductor devices, it is arduous to assess a junction temperature of a device directly. It is even more difficult to assess a junction temperature of a heat generating device which has high power density and are prone to cause overheating during operation (which can be referred to as being under "on-state"). Junction temperature of such heat generating device may fluctuate or continuously elevate during an interval and thereby deviated from a target junction temperature for device performance characterization. The difference between the real junction temperature and the target junction temperature may cause inaccuracy of device characterization and such imprecise result may, on one hand, be carried to the upper stream causing erroneous circuit design and, on the other hand, preventing the device which passed the characterization from performing appropriately of its assigned function.

In order to improve the precision of characterizing a device under test under a junction temperature within a tolerable predetermined range, the present disclosure provides a method for determining a junction temperature of a device under test, a method for controlling a junction temperature of a device under test, and a method for characterizing a device under test. Specifically, a reference diode is disposed adjacent to the device under test is utilized to derive the junction temperature of a device under test.

The device under test in the present disclosure includes various types of semiconductor devices including diode, for example, heat generating diodes such as laser diode (LD), injection laser diode (ILD), or a light-emitting diode (LED), signal-emitting diodes, sensors, thermal sensors, devices utilized to be incorporated into automobile electronic, devices utilized to be incorporated into mobile phone (such as thermal sensor disposed in a mobile phone), or the like. The junction temperature of the device under test may be greater than an ambient or environment temperature since the device under test may generate heat during operation.

Referring to FIG. 1, FIG. 1 shows a flow chart representing various operations of a method for determining a junction temperature of a device under test, in accordance with some embodiments of the present disclosure. The method 100 for determining a junction temperature of a device under test includes obtaining a current-temperature characteristic of a reference diode (operation 101, which can be referred to FIG. 3 to FIG. 5), applying a reverse bias to a reference diode adjacent to the device under test (operation 103, which can be referred to FIG. 8 and FIG. 9), obtaining a calibration current of the reference diode under the reverse bias (operation 105, which can be referred to FIG. 8 and FIG. 9) and deriving the junction temperature of the device under test according to a predetermined current-temperature characteristic of the reference diode (operation 107, which can be referred to FIG. 8 and FIG. 11).

Figure 2:
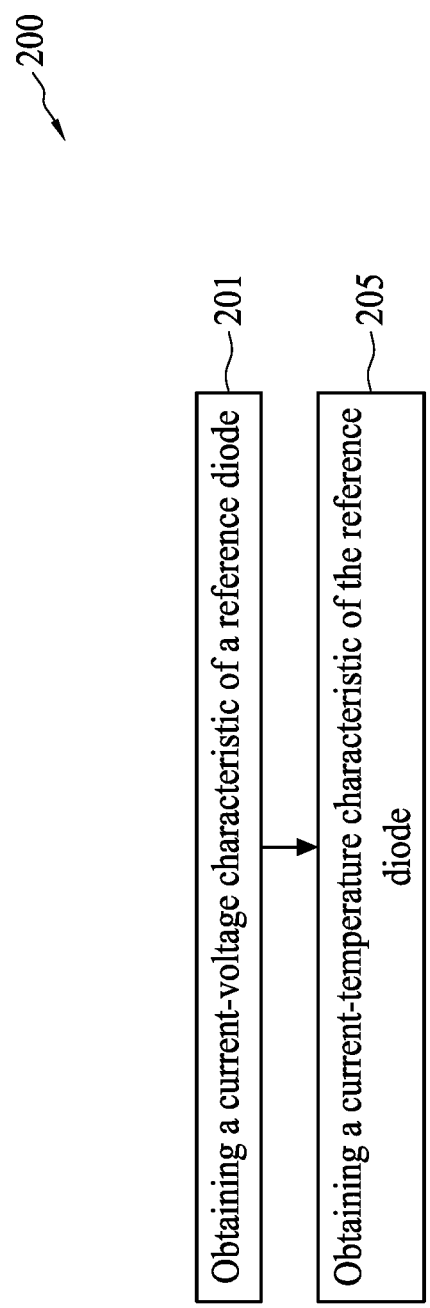
FIG. 2 shows a flow chart representing various operations of a method for characterizing a reference diode, in accordance with some embodiments of the present disclosure.

Referring to FIG. 2, FIG. 2 shows a flow chart representing various operations of a method for characterizing a reference diode, in accordance with some embodiments of the present disclosure. The method 200 for characterizing a reference diode includes obtaining a current-voltage characteristic of a reference diode (operation 201, which can be referred to FIG. 4) and obtaining a current-temperature characteristic of the reference diode (operation 205, which can be referred to FIG. 5).

Figure 3:
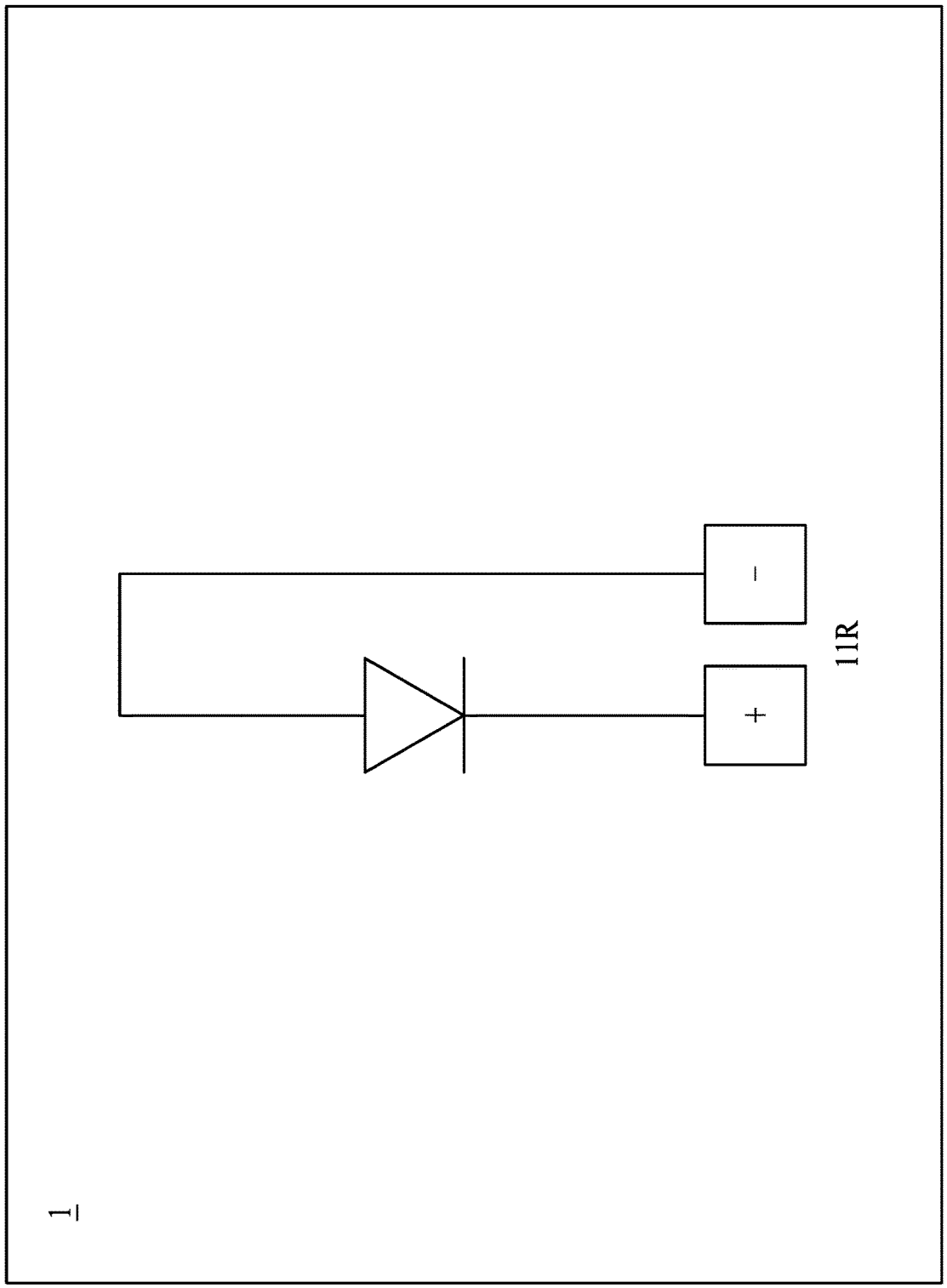
FIG. 3 is a schematic drawing illustrating a reference diode under reverse bias, in accordance with some embodiments of the present disclosure.
Figure 4:
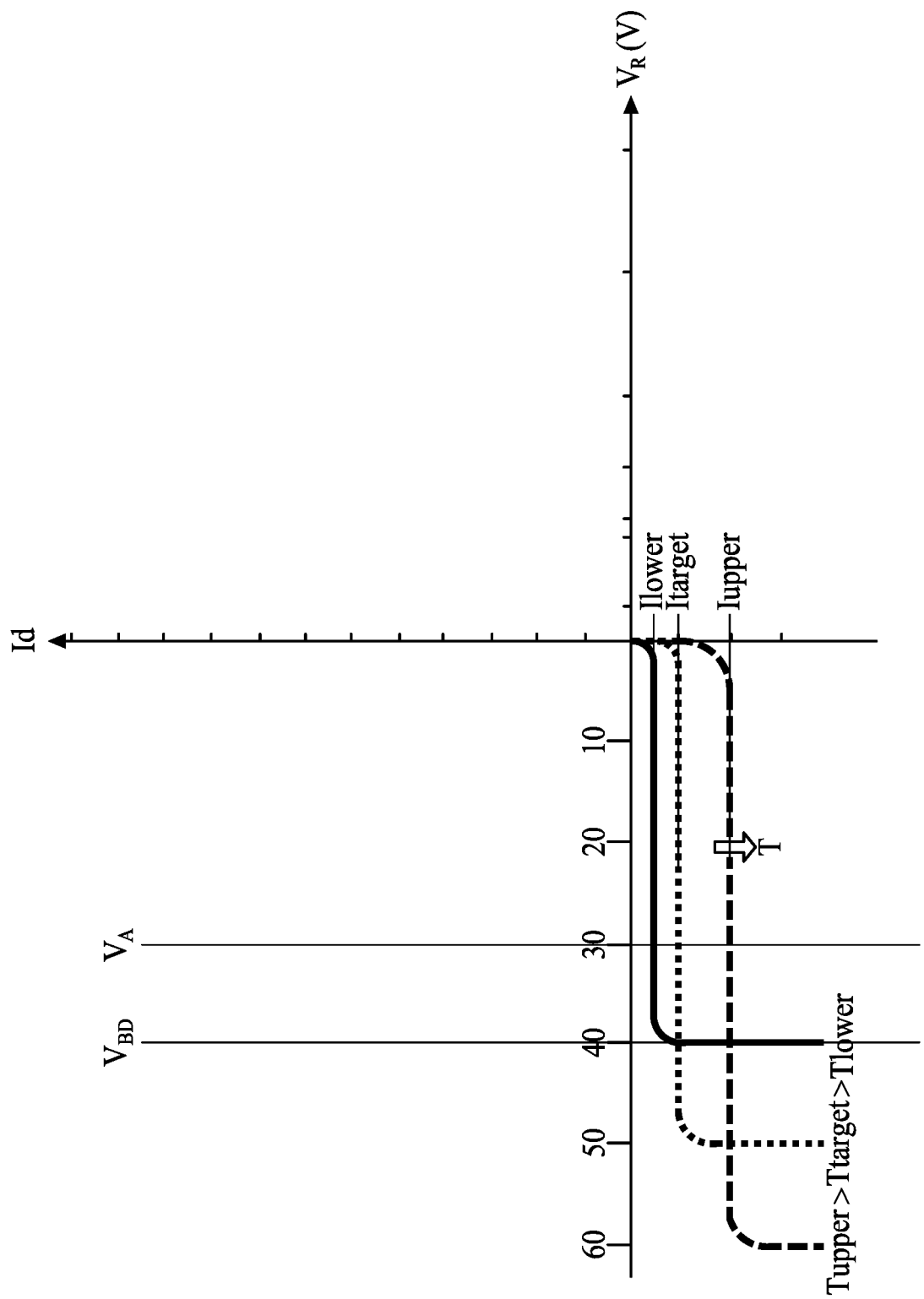
FIG. 4 is a diagram illustrating a current-voltage characteristic of a reference diode, in accordance with some embodiments of the present disclosure.

Referring to FIG. 3 and FIG. 4, FIG. 3 is a schematic drawing illustrating a reference diode under reverse bias, and FIG. 4 is a diagram illustrating a current-voltage characteristic of the reference diode of FIG. 3, in accordance with some embodiments of the present disclosure. An environment temperature subject to the reference diode of FIG. 3 may be controlled through suitable means, for example, the reference diode of FIG. 3 may be placed on a heatable chuck or in a temperature-adjustable oven.

Figure 9:
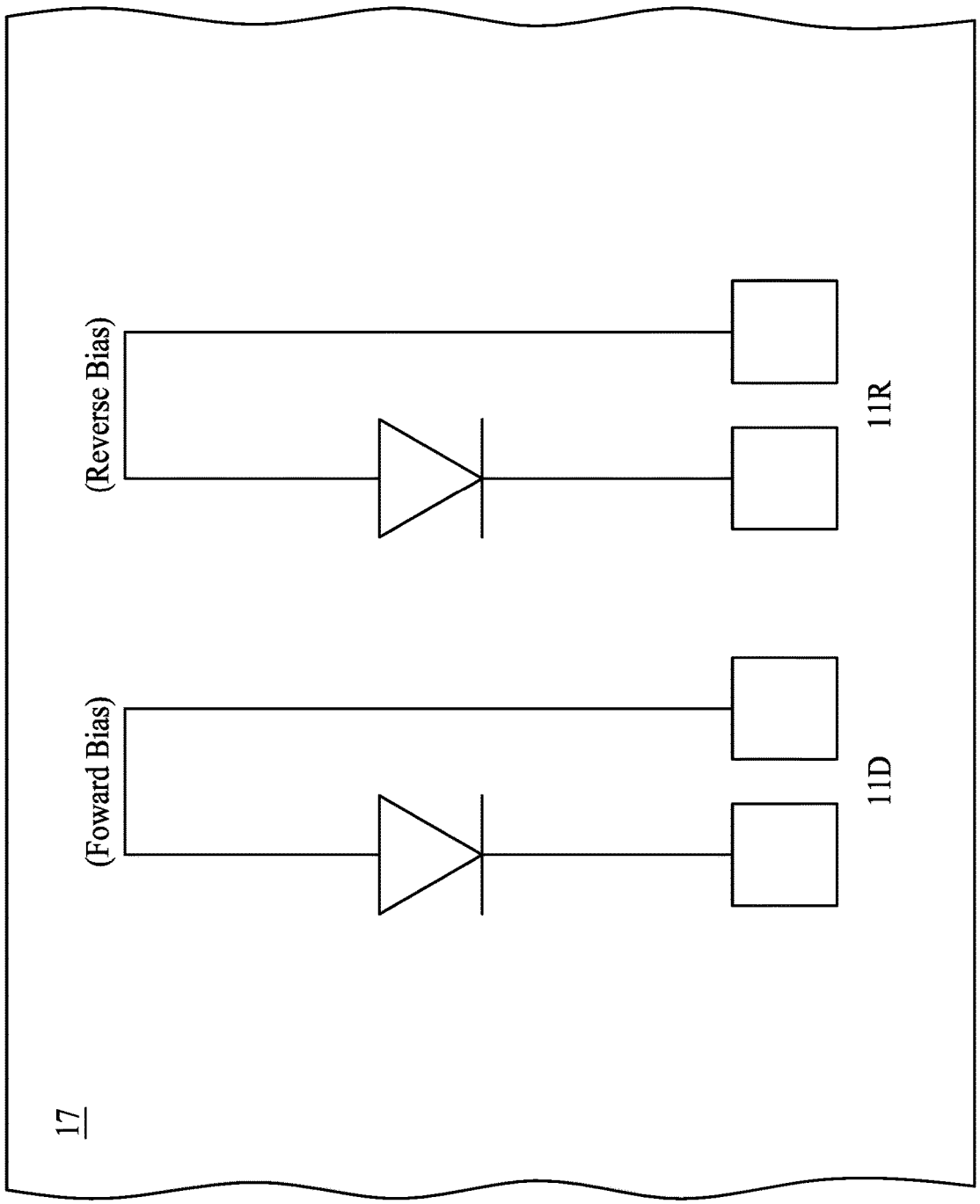
FIG. 9 is a schematic drawing illustrating a semiconductor device including a device under test and a reference diode, in accordance with some embodiments of the present disclosure.

Prior to assessing the junction temperature of the device under test 11D (as shown in FIG. 9), a reference diode 11R for deriving a junction temperature of the device under test 11D is characterized. It should be noted that the reference diode for current-temperature characteristic calibration and the reference diode for deriving a junction temperature of the device under test 11D may, or may not be different. In FIG. 9, for the sake of simplicity, the reference diode for current-temperature characteristic calibration and the reference diode for deriving a junction temperature of the device under test are illustrated as the same.

However, if the reference diode for current-temperature characteristic calibration and the reference diode for deriving a junction temperature of the device under test 11D are to be different ones, they may have identical (or at least comparable) characteristics. For example, they may both be a same type of LD, ILD, LED, signal-emitting diode, sensor, thermal sensor, devices utilized to be incorporated into automobile electronic, or devices utilized to be incorporated into mobile phone (such as thermal sensor disposed in a mobile phone). In some embodiments, the reference diode 11R for current-temperature characteristic calibration is disposed on or inside a substrate, a wafer, a testing carrier, or a device. Under such circumstances, for the purpose of conciseness, the reference diode for current-temperature characteristic calibration and the reference diode for determining a junction temperature of the device under test 11D are both denoted as 11R in current disclosure.

In some embodiments, in order to obtain a current-voltage characteristic of the reference diode 11R under reverse bias and under a plurality of temperature points of interest, the reference diode 11R is disposed inside an oven 1, for example, wherein a temperature of the oven 1 can be adjusted either manually or automatically. Alternatively, in some other embodiments, the reference diode 11R is supported and heated by a chuck 19 (shown in FIG. 8). In order to precisely control the junction temperature of the reference diode 11R, an environment temperature subject to the reference diode 11R is first set up by the oven 1 or the chuck 19, the junction temperature of the reference diode 11R disposed in the oven 1 or the chuck 19 substantially reaches thermal-equilibrium to the environment temperature after suitable duration. Subsequently, a reverse bias $V_R$ is applied to the reference diode 11R whose junction temperature substantially reaches thermal-equilibrium to the environment temperature.

Specifically, since the reference diode 11R is under reverse bias (which the device can be referred to as being under "off-state"), the heat generated under "off-state" can be negligible, thus the thermal-equilibrium junction temperature of the reference diode 11R is identical or approximate to the environment temperature, i.e., temperature of the oven 1 or the chuck 19. Referring to FIG. 4, under a first temperature point of interest $T_{lower}$, by scanning the reverse bias $V_R$ within a suitable range, a current-voltage characteristic of the reference diode 11R under the first temperature point of interest $T_{lower}$ can be obtained, as shown in FIG. 4. Similarly, a current-voltage characteristic of the reference diode 11R will then be calibrated under a second temperature point of interest $T_{target}$ and a third temperature point of interest $T_{upper}$, etc., as illustrated in FIG. 4. It is noteworthy that the plurality of temperature points of interest may be in a range of operation temperatures of the device under test 11D. For example, an operation temperature of a device under test 11D can be in a range of from about 25° C. to about 125° C., thus the current-voltage characteristic of the reference diode 11R may be calibrated under 25° C., 50° C., 75° C., 100° C., 125° C., or with various intervals. However, the present disclosure is not limited thereto. The operation temperature range of the device under test 11D may be between an operable temperature range thereof, which may be in a range of from about 1.5K to about 800K, for example. It is also noteworthy that a reverse bias applied to the reference diode 11R for current-voltage characteristic is above the breakdown voltage $V_{BD}$ under the given temperature point of interest. Various temperature points of interest may lead to different breakdown voltages $V_{BD}$, therefore, the reverse bias applied to the reference diode 11R for obtaining current-voltage characteristic shall be greater than the breakdown voltages $V_B$ under all temperature points of interest. As illustrated in FIG. 4, the reverse bias $V_A$, or the testing reverse bias $V_A$ as used herein, is above the breakdown voltages $V_{BD}$ under the first, the second, and the third temperature points of interest $T_{lower}$, $T_{target}$, $T_{upper}$.

Figure 5:
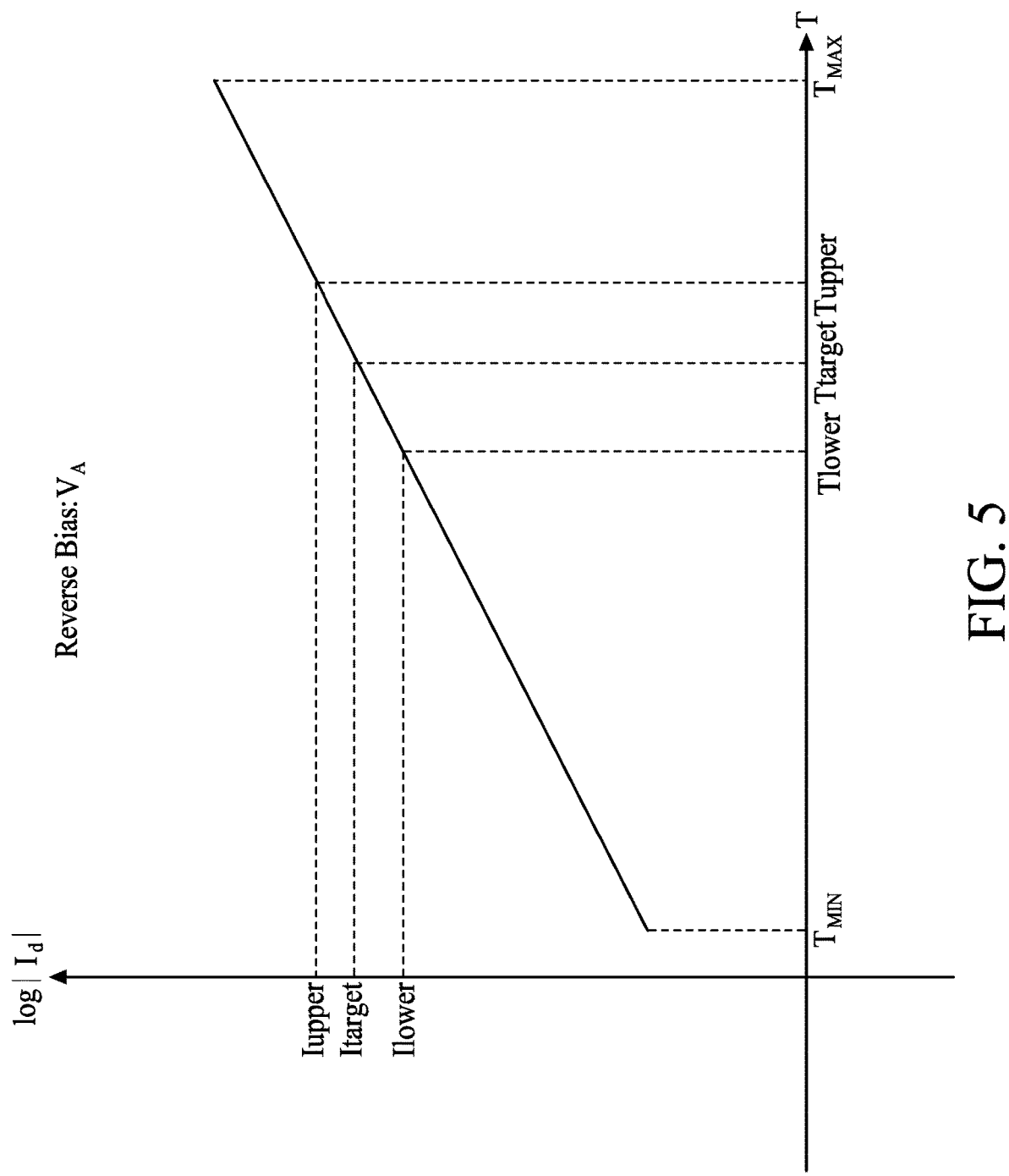
FIG. 5 is a diagram illustrating a current-temperature characteristic of a reference diode, in accordance with some embodiments of the present disclosure.
Figure 8:
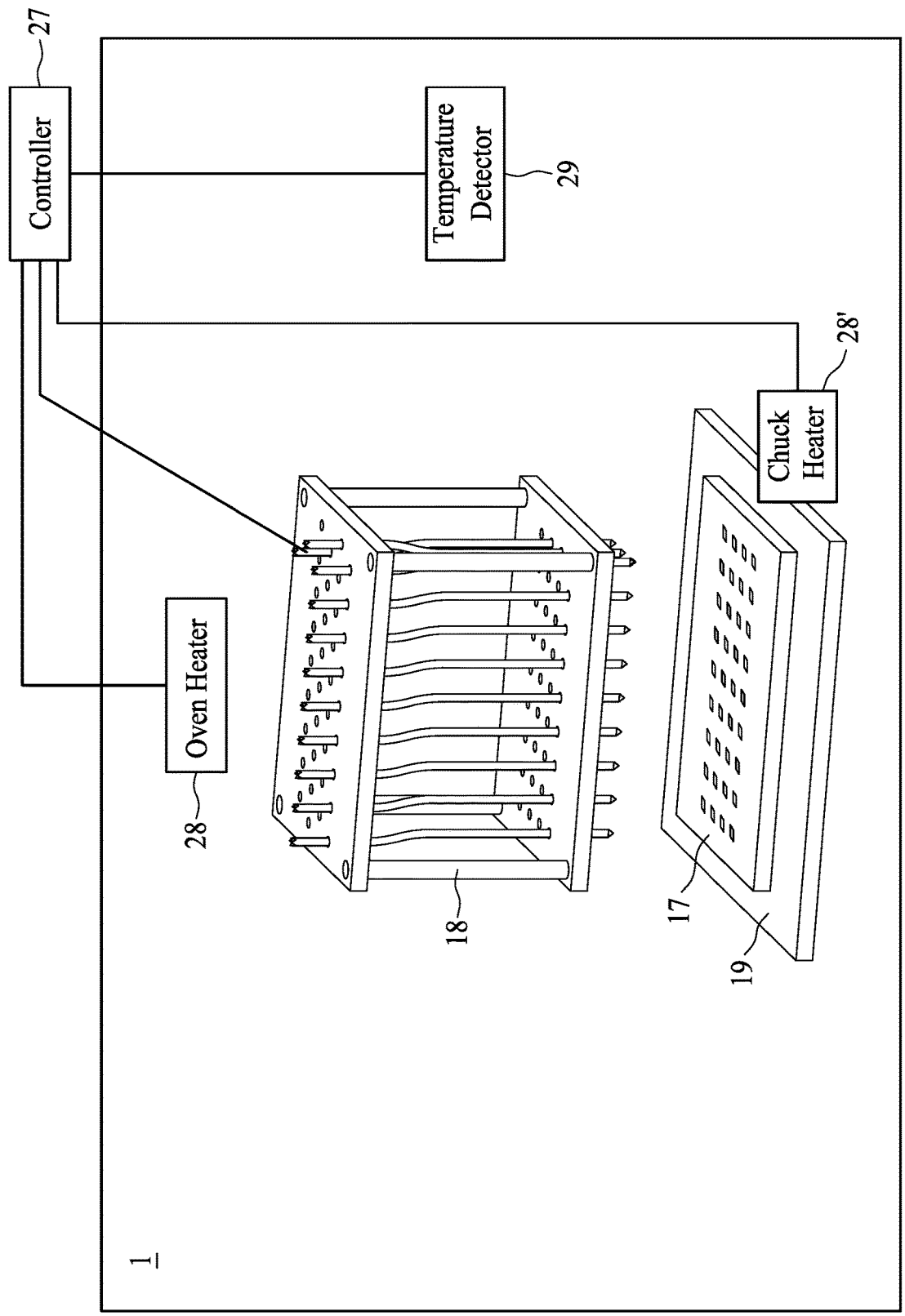
FIG. 8 is a schematic drawing illustrating an apparatus for testing a device under test, in accordance with some embodiments of the present disclosure.

Referring to FIG. 4 and FIG. 5, FIG. 5 is a diagram illustrating a current-temperature characteristic of a reference diode, in accordance with some embodiments of the present disclosure. A current-temperature characteristic of the reference diode 11R can be derived from the current-voltage characteristic of the reference diode 11R obtained in FIG. 4. Specifically, a testing reverse bias $V_A$ is selected in consideration of the breakdown voltages $V_{BD}$, as previously addressed. Under the given testing reverse bias $V_A$, a diagram of the current-temperature characteristic of the reference diode 11R can be obtained by combining the junction temperature of the reference diode 11R (which is identical or approximate to the environment temperature, i.e., the temperature of the oven 1 or the chuck 19, as shown in FIG. 8) and the amount of the measured reverse current corresponding to the testing reverse bias $V_A$ under various temperature points of interest. In some embodiments, for the sake of mathematical representation, the amount of the reverse current can be denoted in absolute value. It should be noted that herein the range of the temperature shown in FIG. 5 (which is between $T_{MAX}$ and $T_{MIN}$) is corresponded to the range of operation temperature of the junction of the device under test 11D, for example as previously provided, $T_{MIN}$ is 25° C. and $T_{MAX}$ is 125° C.

As shown in FIG. 5, the diagram of the current-temperature characteristic of the reference diode 11R can be presented in a semi logarithmic plot. That is, the magnitude of the absolute value of the measured reverse current is presented in a logarithmic scale along y-axis shown in FIG. 5. In the semi logarithmic diagram of the current-temperature characteristic of the reference diode 11R, a relationship between the logarithm of the absolute value of measured reverse current to base 10 (i.e. log $|I_d|$) and the junction temperature of the reference diode 11R (which is identical or approximate to the environment temperature, i.e., the temperature of the oven 1 or the chuck 19, as shown in FIG. 8) is positively correlated. In some embodiments, log $|I_d|$ and temperature points of interest demonstrate a linear relation therebetween at least in some temperature intervals, as shown in FIG. 5.

Figure 6:
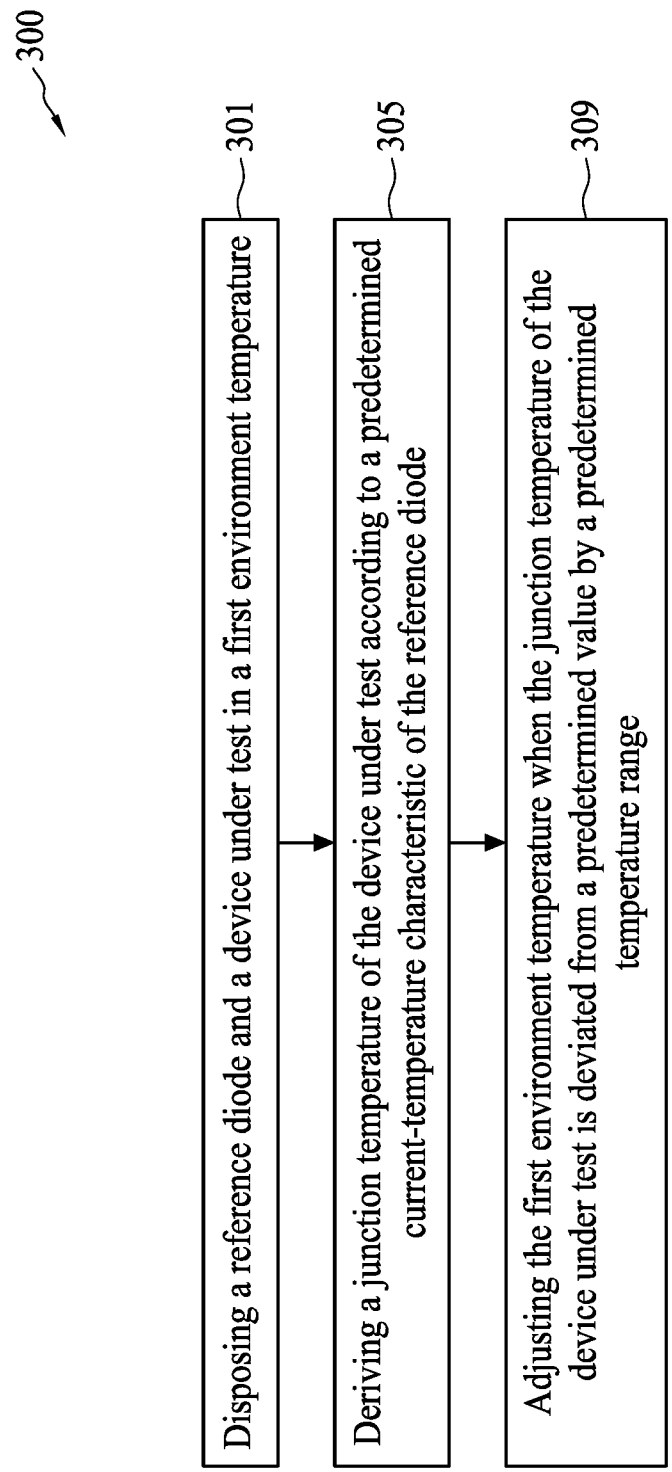
FIG. 6 shows a flow chart representing various operations of a method for characterizing a device under test, in accordance with some embodiments of the present disclosure.

Referring to FIG. 6, FIG. 6 shows a flow chart representing various operations of a method for characterizing a device under test, in accordance with some embodiments of the present disclosure. The method 300 for characterizing a device under test includes disposing a reference diode and a device under test in a first environment temperature (operation 301, which can be referred to FIG. 8 and FIG. 9), deriving a junction temperature of the device under test according to a predetermined current-temperature characteristic of the reference diode (operation 305, which can be referred to FIG. 8 and FIG. 9), and adjusting the first environment temperature when the junction temperature of the device under test is deviated from the a predetermined temperature by a predetermined temperature range (operation 309, which can be referred to FIG. 8 to FIG. 11).

Figure 7:
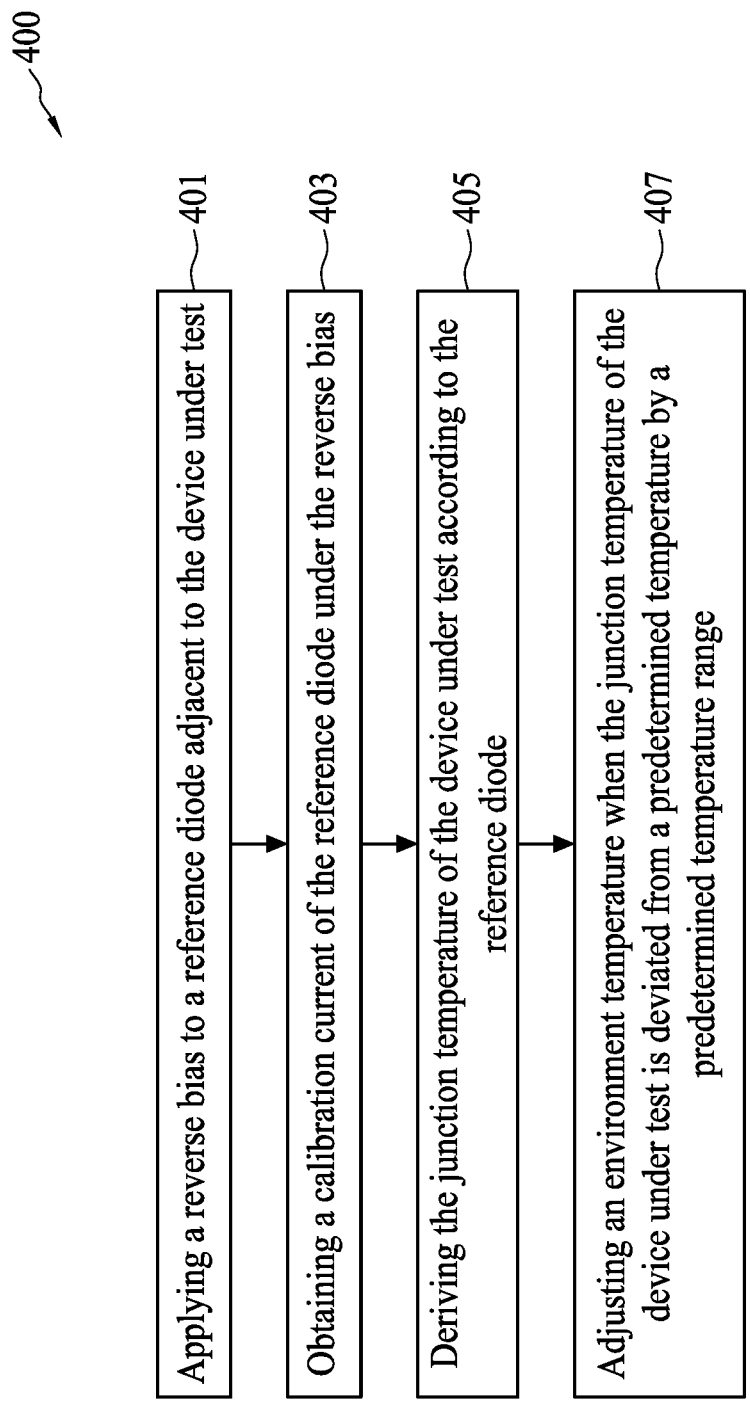
FIG. 7 shows a flow chart representing various operations of a method for controlling a junction temperature of a device under test, in accordance with some embodiments of the present disclosure.

Referring to FIG. 7, FIG. 7 shows a flow chart representing various operations of a method for controlling a junction temperature of a device under test, in accordance with some embodiments of the present disclosure. The method 400 for controlling a junction temperature of a device under test includes applying a reverse bias to a reference diode adjacent to the device under test (operation 401, which can be referred to FIG. 8 and FIG. 9), obtaining a calibration current of the reference diode under the reverse bias (operation 403, which can be referred to FIG. 8 and FIG. 9), deriving the junction temperature of the device under test according to the reference diode (operation 405, which can be referred to FIG. 8 and FIG. 9), and adjusting an environment temperature when the junction temperature of the device under test is deviated from a predetermined value by a predetermined temperature range (operation 407, which can be referred to FIG. 8 to FIG. 11).

Referring to FIG. 8 and FIG. 9, FIG. 8 is a schematic drawing illustrating an apparatus for testing a device under test, and FIG. 9 is a schematic drawing illustrating a semiconductor device including a device under test and a reference diode, in accordance with some embodiments of the present disclosure. As previously addressed, it is arduous to directly assess the junction temperature of the device under test 11D, the reference diode 11R of the present disclosure is therefore disposed adjacent to the device under test 11D, allowing itself to derive the junction temperature of the device under test 11D. In some embodiments, when the device under test 11D is operated under a forward bias (which the device can be referred to as being under "on-state"), the device under test 11D may generate heat that locally influence the environment temperature. A junction temperature of the device under test 11D may be greater than the environment temperature (which can be the temperature of the oven 1 or the temperature of the chuck 19) and may thereby elevate a junction temperature of the reference diode 11R adjacently disposed. Due to the proximity, the junction temperature of the reference diode 11R may be elevated to be identical or at least approximate to the junction temperature of the device under test 11D. In some embodiments, in order to further improve the accuracy of determining the junction temperature of the device under test 11D, the reference diode 11R is disposed immediately next to the device under test 11D (as shown in FIG. 9) so that a difference between the junction temperature of the reference diode 11R and the junction temperature of the device under test 11D may be neglected.

Specifically, a substrate 17 having the device under test 11D and the reference diode 11R is disposed inside an oven 1, wherein the substrate 17 is disposed on a supporter. In some embodiments, the supporter can be a heatable chuck 19. In some embodiments, when the supporter is a heatable chuck 19, the device characterization can be conducted in ambient environment or without the oven 1. In some embodiments, as illustrated in FIG. 8, the device characterization can be conducted in the oven 1 with the heatable chuck 19. The temperature of the oven 1 is initially set as a first environment temperature when the oven 1 is the major heating-controlling source. In some alternate embodiments, the temperature of the chuck 19 may be deemed as the first environment temperature when the chuck 19 is the major heating-controlling source. In some alternate embodiments, the temperature of the chuck 19 may be deemed as the first environment temperature if the temperature of the substrate 17 is more governed by the chuck 19 than the oven 1.

The accuracy of determining the junction temperature of the device under test 11D over the substrate 17 may be positively correlated to the density of the reference diode 11R on the substrate 17. In some embodiments, since different regions on the substrate 17 may have different types and/or densities of the device under test 11D, each region may possess device under tests with different junction temperatures, and thus each region may at least include one reference diode. Of course, greater amount of reference diodes 11R can be disposed in a particular region if the accuracy of junction temperature monitoring is of primary concern. Higher variety of temperature distribution across the substrate 17 (or a semiconductor chip) as a result of different types and/or densities of the device under tests 11D may require greater types and/or amount of reference diode 11R to improve the accuracy of junction temperature monitoring. In some other embodiments, when the substrate 17 has a substantially uniform temperature as a result of uniform types and/or densities of device under tests 11D, the quantity of the reference diode 11R can be reduced in order to reduce characterization cost.

As shown in FIG. 8, a probe tester 18, which includes a plurality of probe pins, is configured to apply the predetermined testing reverse bias $V_A$ (as previously discussed in FIG. 4 and FIG. 5) to the reference diode 11R by a first group of probe pins and simultaneously apply a forward bias to the device under test 11D by a second group of probe pins. As previously discussed, the device under test 11D may generate heat under forward bias while the reference diode 11R may generate negligible heat under reverse bias. If the device under test 11D and the reference diode 11R are disposed far away to each other so as to minimize mutual influence as far as heat conduction is concerned, the junction temperature of the device under test 11D may be greater than the first environment temperature and the that of the reference diode 11R may be approximate to the first environment temperature. However, if the device under test 11D and the reference diode 11R are disposed close enough to each other so as to maximize mutual influence as far as heat conduction is concerned, junction temperature of the reference diode 11R may be elevated to the extent of being identical or approximate to the junction temperature of the device under test 11D. Alternatively stated, an approximate junction temperature of the device under test 11D can be derived by obtaining or probing the junction temperature of the reference diode 11R. The first group of the probe pins on the probe tester 18 may obtain a bias current generated by the reference diode 11R under the testing reverse bias $V_A$. The bias current generated by the reference diode 11R or the measured current can be further correlated to the junction temperature of the reference diode 11R according to the current-temperature characteristic shown in FIG. 5. Subsequently, the junction temperature of the reference diode 11R can be considered approximate or identical to the junction temperature of the device under test 11D.

Referring back to FIG. 5, ideally the device characterization is conducted under the first environment temperature, which may also be considered as the junction temperature of the device under test 11D when thermal equilibrium is reached. However, since the device under test 11D may be a heat-generating device, the junction temperature of the device under test 11D may be elevated to an extent that deviated from a predetermined target temperature after a period of time or deviated from a target value due to the fluctuation of the first environment temperature. Such deviation may lead to faulty characterization result of the device under test 11D. Thus, the junction temperature of the device under test 11D is controlled not to be deviated from a predetermined target temperature $T_{target}$ by more than a predetermined temperature range. Alternatively stated, the junction temperature of the device under test 11D is controlled to be between an upper temperature threshold $T_{upper}$ and a lower temperature threshold $T_{lower}$. The predetermined target temperature $T_{target}$ is between the upper temperature threshold $T_{upper}$ and the lower temperature threshold $T_{lower}$. For example, the junction temperature of the device under test 11D is controlled to be below the predetermined target temperature $T_{target}$ plus 3° C. (i.e. $T_{upper}=T_{target}+3°$ C.) and above the predetermined target temperature $T_{target}$ minus 3° C. (i.e. $T_{lower}=T_{target}-3°$ C.) Of course the predetermined temperature range may be of other amount based on other consideration such as the requirement of device characterization accuracy or the cost. In some embodiments, the predetermined target temperature $T_{target}$ may be different from the first environment temperature. In some other embodiments, the predetermined target temperature $T_{target}$ may be identical with the first environment temperature.

In order to determine if the junction temperature of the device under test 11D is deviated from the predetermined target temperature $T_{target}$ by more than a predetermined temperature range (i.e. outside of the range between the upper temperature threshold $T_{upper}$ and the lower temperature threshold $T_{lower}$), a predetermined current range is derived from the predetermined temperature range by utilizing the current-temperature characteristic of the reference diode 11R. Alternatively stated, on the diagram of the current-temperature characteristic of the reference diode 11R, the upper current threshold $I_{upper}$ corresponds to the upper temperature threshold $T_{upper}$, the lower current threshold $I_{upper}$ corresponds to the lower temperature threshold $T_{lower}$, and a target current magnitude $I_{target}$ corresponds to the predetermined target temperature $T_{target}$. Since the reverse current generated by the reference diode 11R under the testing reverse bias $V_A$ can be directly measured by the first group of probe pins of the probe tester 18, the magnitude of the reverse current can be utilized to determine if the junction temperature of the reference diode 11R (which is identical to or similar to the junction temperature of the device under test 11D) is outside of the range between the upper temperature threshold $T_{upper}$ and the lower temperature threshold $T_{lower}$. Therefore, if the absolute value of measured reverse current is greater than the upper current threshold $I_{upper}$ or if the absolute value of measured reverse current is less than the lower current threshold $I_{lower}$, the environment temperature provided by the oven 1 and/or provided by the chuck 19 may be adjusted so that the junction temperature of the device under test 11D can be controlled to be in the range between the lower temperature threshold $T_{lower}$ and the upper temperature threshold $T_{upper}$.

For example, under the derivation of the predetermined current range from the predetermined temperature range, the upper current threshold $I_{upper}$ corresponds to the predetermined target temperature $T_{target}$ plus 3° C. (i.e. $T_{upper}=T_{target}+3°$ C.) and the lower current threshold $I_{lower}$ corresponds to the predetermined target temperature $T_{target}$ minus 3° C. (i.e. $T_{lower}=T_{target}-3°$ C.). Under the first environment temperature, if the absolute value of measured reverse current is not in the range, it can be determined that the junction temperature of the reference diode 11R is greater than the predetermined target temperature $T_{target}$ by more than 3° C. or below than the predetermined target temperature $T_{target}$ by more than 3+ C. Therefore, when the junction temperature of the reference diode 11R is greater than the predetermined target temperature $T_{target}$ by more than 3° C., indicating that the junction temperature of the device under test 11D being approximately greater than the predetermined target temperature $T_{target}$ by more than 3° C., a controller 27 may instruct an oven heater 28 or a chuck heater 28' to lower the first environment temperature to a second environment temperature. Similarly, when the junction temperature of the reference diode 11R is less than the predetermined target temperature $T_{target}$ by more than 3° C., indicating that the junction temperature of the device under test 11D being approximately lower than the predetermined target temperature $T_{target}$ by more than 3° C., a controller 27 may instruct the oven heater 28 or the chuck heater 28' to increase the first environment temperature to a second environment temperature.

Figure 10:
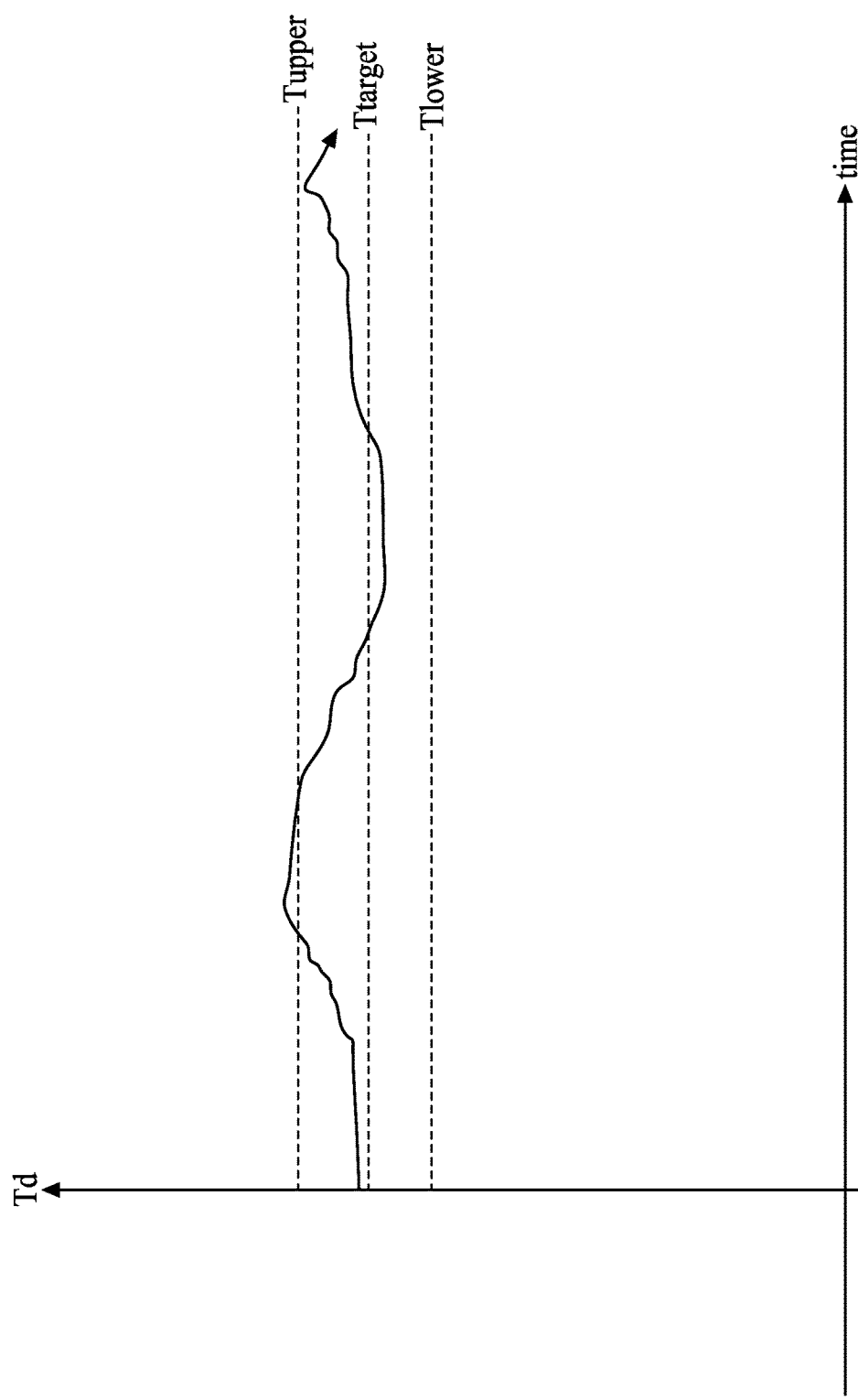
FIG. 10 is a diagram illustrating a changing of a temperature of a junction of a device under test during a period of time, in accordance with some embodiments of the present disclosure.
Figure 11:
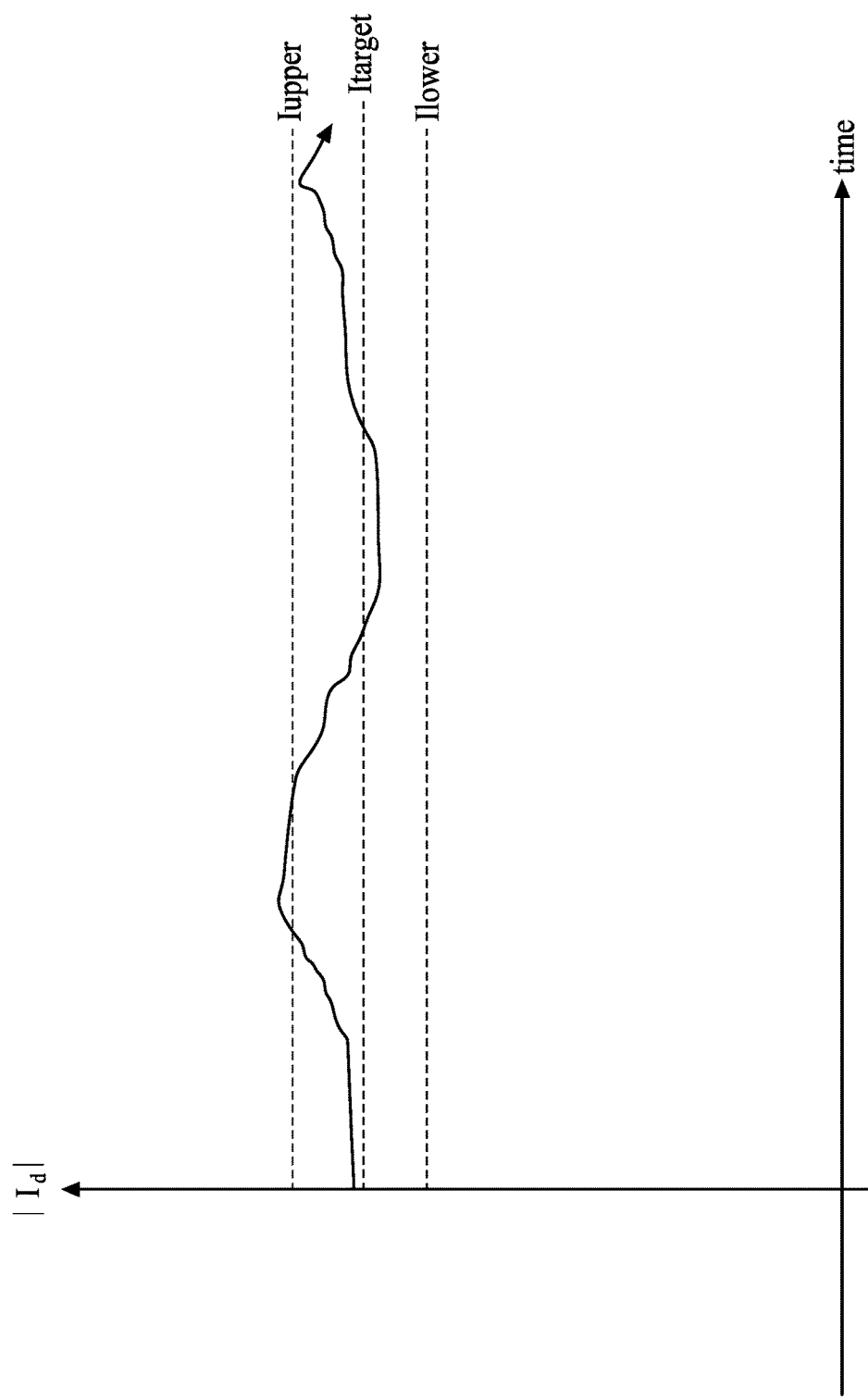
FIG. 11 is a diagram illustrating a changing of a current of a reference diode during a period of time, in accordance with some embodiments of the present disclosure.

Referring to FIG. 5, FIG. 8, FIG. 10 and FIG. 11, FIG. 10 is a diagram illustrating a changing of a temperature of a junction of a device under test during a period of time, and FIG. 11 is a diagram illustrating a changing of a current of a reference diode during a period of time, in accordance with some embodiments of the present disclosure. The junction temperature of the device under test 11D is positively correlated to the environment temperature. As previously discussed in FIG. 5, in order stabilize the junction temperature of the device under test 11D and control the junction temperature of the device under test 11D to be in the range between the lower temperature threshold $T_{lower}$ and the upper temperature threshold $T_{upper}$ as shown in FIG. 10, the environment temperature of the oven 1 and/or the chuck 19 may be adjusted in accordance to the measured reverse current. In order to facilitate the accuracy of controlling over the junction temperature of the device under test 11 via the adjustment of the environment temperature of the oven 1 and/or the chuck 19, the controller 27 is utilized. The controller 27 is connected to the oven heater 28 and/or the chuck heater 28' to control the heat flux applied to the substrate 17. The controller 27 controls the oven heater 28 and/or the chuck heater 28' to stabilize the junction temperature of the device under test 11D, reducing the temperature fluctuation and/or the tendency of passing over or under the predetermined temperature range.

A temperature detector 29 configured to detect a temperature of the substrate 17, oven heater 28 and/or the chuck heater 28' may optionally be incorporated to improve the accuracy of temperature control by providing error feedback to the controller 27. In some embodiments, the controller 27 may be a proportional-integral-derivative controller (PID) controller. In some other embodiments, the controller 27 may be a proportional-integral controller (PI) controller, proportional-derivative controller (PD) controller, proportional controller (P controller), or integral controller (I controller). The choice of controller may be based on the type of device under test 11D and the predetermined temperature range for aiming to limit the temperature fluctuation. For example, the proportional-integral-derivative controller (PID) controller may be more responsive to alteration of temperature changes; while the proportional-integral controller (PI) controller may be more stable. Alternatively stated, the controller 27 may compensate the tendency/fluctuation of junction temperature of device under test 11D by detecting the measured reverse current generated by the reference diode 11R disposed adjacent to the device under test 11D.

As shown FIG. 11, by adjusting environment temperature, the absolute value of measured reverse current generated by the reference diode 11R can be controlled to be in a range from the upper current threshold $I_{upper}$ to the lower current threshold $I_{lower}$ during a certain interval for characterizing the device under test 11D. This indicates that the junction temperature of the device under test 11D (which is identical to or similar to the junction temperature of the reference diode 11R) can be controlled to be in a range from the upper temperature threshold $T_{upper}$ to the lower temperature threshold $T_{lower}$ during a certain interval for characterizing the device under test 11D with less error, since the junction temperature of the device under test 11D derived from the junction temperature of the reference diode 11R is precisely measured and controlled.

After the junction temperature of the device under test 11D stabilizes, a characterizing test of the device under test 11D can be performed. For example, the probe tester 18 may measure the current-voltage characteristics of the device under test 11D by a voltage scan. Other testing or characterization on various device properties can also be performed by the probe tester 18 after the junction temperature of the device under test 11D stabilizes.

In the present disclosure, the controller 27 may be implemented by software such that the methods disclosed herein can be performed automatically or semi-automatically. For a given computer, the software routines can be stored on a storage device, such as a permanent memory. Alternately, the software routines can be machine executable instructions stored using any machine readable storage medium, such as a diskette, CD-ROM, magnetic tape, digital video or versatile disk (DVD), laser disk, ROM, flash memory, etc. The series of instructions can be received from a remote storage device, such as a server on a network. The present invention can also be implemented in hardware systems, microcontroller unit (MCU) modules, discrete hardware or firmware.

Since it is difficult to measure a junction temperature of a device under test directly, especially a junction temperature of a heat-generating device which possesses high power density, the present disclosure provides a method for determining a junction temperature of a device under test 11D. By a reference diode 11R disposed adjacent to the device under test 11D, a junction temperature of the reference diode 11R may be elevated to be identical or approximate to a junction temperature of the device under test 11D, thus a measured reverse current generated by the reference diode 11R under a predetermined reverse bias may not only indicate the junction temperature of the reference diode 11R, but also the junction temperature of the device under test 11D.

Furthermore, since the junction temperature of the device under test 11D may fluctuate at least at the beginning of the characterization or continuously elevating after a period of time, a controller 27 is configured to adjust the environment temperature governed by the oven 1 and/or the chuck 19. The environment temperature is so changed to influence the junction temperature of the device under test 11D. By controlling the junction temperature of the device under test 11D to be in a predetermined range, the operation of characterizing the device under test 11D can be performed with better accuracy.

Some embodiments of the present disclosure provide a method for controlling a junction temperature of a device under test, including applying a reverse bias to a reference diode adjacent to the device under test, obtaining a calibration current of the reference diode under the reverse bias, deriving the junction temperature of the device under test according to the reference diode, and adjusting an environment temperature when the junction temperature of the device under test is deviated from a predetermined value by a predetermined temperature range.

Some embodiments of the present disclosure provide a method for determining a junction temperature of a device under test, including applying a reverse bias to a reference diode adjacent to the device under test, obtaining a calibration current of the reference diode under the reverse bias, and deriving the junction temperature of the device under test according to a predetermined current-temperature characteristic of the reference diode.

Some embodiments of the present disclosure provide a method for characterizing a device under test, including disposing a reference diode and a device under test in a first environment temperature, deriving a junction temperature of the device under test according to a predetermined current-temperature characteristic of the reference diode, and adjusting the first environment temperature when the junction temperature of the device under test is deviated from the a predetermined temperature by a predetermined temperature range.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for controlling a junction temperature of a device under test, comprising:
    applying a reverse bias to a reference diode adjacent to the device under test;
    applying a forward bias to the device under test while applying the reverse bias to the reference diode;
    obtaining a calibration current of the reference diode under the reverse bias;
    deriving the junction temperature of the device under test according to the reference diode; and
    adjusting an environment temperature when the junction temperature of the device under test is deviated from a predetermined value by a predetermined temperature range.

2. The method of claim 1, wherein applying the reverse bias to the reference diode is performed under a plurality of temperature points.

3. The method of claim 1, wherein deriving the junction temperature of the device under test according to the reference diode comprises referencing to a predetermined current-temperature characteristic of the reference diode.

4. The method of claim 3, comprising adjusting the environment temperature when a measured current of the reference diode is deviated from a predetermined value by a predetermined current range.

5. The method of claim 4, further comprising deriving the predetermined current range from the predetermined temperature range according to the predetermined current-temperature characteristic of the reference diode.

6. The method of claim 1, wherein adjusting the environment temperature comprises increasing the environment temperature when the junction temperature is below the predetermined value by about 3 degrees Celsius.

7. The method of claim 1, wherein adjusting the environment temperature comprises decreasing the environment temperature when the junction temperature is above the predetermined value by about 3 degrees Celsius.

8. The method of claim 1, wherein adjusting the environment temperature comprises adjusting a temperature of an oven or a chuck where the device under test and the reference diode are disposed.

9. A method for determining a junction temperature of a device under test, comprising:
    applying a reverse bias to a reference diode adjacent to the device under test;
    obtaining a calibration current of the reference diode under the reverse bias; and
    deriving the junction temperature of the device under test according to a predetermined current-temperature characteristic of the reference diode,
    wherein deriving the junction temperature of the device under test comprises obtaining a measured current of the reference diode under the reverse bias while applying a forward bias to the device under test.

10. The method of claim 9, wherein the reference diode is next to the device under test.

11. The method of claim 9, wherein the predetermined current-temperature characteristic of the reference diode is measured under the reverse bias at a plurality of temperature points.

12. A method for characterizing a device under test, comprising:
    disposing a reference diode and the device under test in a first environment temperature;
    deriving a junction temperature of the device under test according to a predetermined current-temperature characteristic of the reference diode; and
    adjusting the first environment temperature when the junction temperature of the device under test is deviated from the a predetermined temperature by a predetermined temperature range,
    wherein deriving the junction temperature of the device under test further comprises applying a reverse bias on the reference diode and a forward bias on the device under test simultaneously.

13. The method of claim 12, wherein the predetermined temperature range is within plus or minus 3 degrees Celsius.

14. The method of claim 12, wherein the predetermined current-temperature characteristic of the reference diode is measured under the reverse bias at a plurality of temperature points.

15. The method of claim 14, wherein the plurality of temperature points are in a range of from about 25 degrees Celsius to about 125 degrees Celsius.

16. The method of claim 12, wherein adjusting the first environment temperature comprises decreasing the first environment temperature to a second environment temperature when the junction temperature of the device under test is greater than the predetermined temperature by the predetermined temperature range.

17. The method of claim 12, wherein the first environment temperature is adjusted by a proportional-integral-derivative (PID) controller.

* * * * *